United States Patent [19]
Seo

[11] Patent Number: 5,140,199
[45] Date of Patent: Aug. 18, 1992

[54] SENSE AMPLIFIER DRIVER FOR MEMORY DEVICE HAVING REDUCED POWER DISSIPATION

[75] Inventor: Seung-mo Seo, Seoul, Rep. of Korea
[73] Assignee: Samsung Electronics Co., Ltd., Rep. of Korea
[21] Appl. No.: 358,679
[22] Filed: May 30, 1989

[30] Foreign Application Priority Data
  Jul. 11, 1988 [KR] Rep. of Korea ............. 88-8607

[51] Int. Cl.$^5$ ............................................. G11C 7/00
[52] U.S. Cl. ............................. 307/530; 307/263; 307/592; 307/601; 365/205; 365/233
[58] Field of Search ............. 307/263, 530, 592, 601, 307/603, 481; 365/194, 205, 233

[56] References Cited

U.S. PATENT DOCUMENTS

| | | | |
|---|---|---|---|
| 3,943,496 | 3/1976 | Padgett et al. | 365/233 |
| 4,295,062 | 10/1981 | Mihalich et al. | 307/290 |
| 4,508,978 | 4/1985 | Reddy | 307/482 |
| 4,638,187 | 1/1987 | Boler et al. | 307/270 |
| 4,649,295 | 3/1987 | McLaughlin et al. | 307/446 |
| 4,707,626 | 11/1987 | Inoue | 307/451 |
| 4,749,882 | 6/1988 | Morgan | 307/451 |
| 4,771,195 | 9/1988 | Stein | 307/451 |
| 4,829,199 | 5/1989 | Prater | 307/451 |
| 4,855,623 | 8/1989 | Flaherty | 307/451 |

FOREIGN PATENT DOCUMENTS

| | | | |
|---|---|---|---|
| 0156226 | 9/1983 | Japan | 307/605 |
| 0070592 | 4/1985 | Japan | 365/233 |
| 0178796 | 8/1986 | Japan | 365/205 |
| 0226111 | 9/1988 | Japan | 307/603 |
| 0275223 | 11/1988 | Japan | 307/481 |

OTHER PUBLICATIONS

IBM Tech. Disc. Bult.; Chakravarti et al.; High Gain Sense Amplifier; Dec. 1977; p. 206.
Wong et al.; Memory Techniques-A 45ns Fully Static 16K MOS ROM; Feb. 19, 1981; p. 150.

Primary Examiner—Stanley D. Miller
Assistant Examiner—Terry D. Cunningham
Attorney, Agent, or Firm—Morgan & Finnegan

[57] ABSTRACT

An improved sense amplifier driver for sensing and restoring data in memory cells is disclosed. Pull-up means in the form of p-channel MOS transistors are respectively provided for forcibly pulling up the gate voltage of delayable p-channel MOS transistors within the first inverter of the sensing clock driver and the second inverter of the restore clock driver in the trailing transient periods of the sensing and restoring clock signals. The formation of a DC current path between the power line and the ground line in any one of the delayable p-channel MOS transistors is prevented, thereby making it possible to avoid the unnecessary power dissipation. Further, delaying resistances are installed respectively in the first inverter of the sensing clock driver and in the second inverter of the restoring clock driver to make the slope of the leading edges of the sensing and restoring clocks less steep, thereby making it possible to exclude the occurrence of noise.

3 Claims, 5 Drawing Sheets

SENSE AMPLIFIER DRIVER FOR MEMORY DEVICE HAVING REDUCED POWER DISSIPATION

FIELD OF THE INVENTION

The present invention relates to sense amplifier circuitry for sensing data from memory cells, and particularly to a sense amplifier driver for driving a sense amplifier by means of sensing clock signals or restoring clock signals having multiple slope characteristics for reducing the peak current during the process of sensing out of or restoring into the CMOS DRAM. The DC current paths within the sensing clock driver and the restoring clock driver are removed, when returning to a precharge state, thereby reducing the dynamic power dissipation due to transient current.

BACKGROUND OF THE INVENTION

Generally, the sense amplifier circuitry installed within a CMOS DRAM device for sensing data from the cell comprises a sensing clock driver, a restoring clock driver, a delay means and a sense amplifier. Sensing clock signals for sensing the data from the cell and restoring clock signals for restoring the data into the cell cause an increase in the peak current if they have steep slope characteristics during transitions from a high level to a low level, or vice versa. In such a case, noise will be generated, and malfunctions can be induced. According to the conventional solutions for this problem, steep slopes generated during transitions of sensing clock signals or restoring clock signals are divided into double or multiple steps in order to obtain gentle slopes. The conventional sense amplifier driver circuit having multi-slope characteristics and referred to in this application is illustrated in FIG. 1.

However, in the circuits according to conventional technologies, despite the above-mentioned advantages, the MOS transistors within the sensing clock driver are simultaneously turned on during a short period of time to form a DC current path, thereby consuming DC current. This is so due to the fact that, when the precharge operation for the sense amplifier is started upon termination of the sensing and restoring operation, delayings of the trailing edges of the sensing clock signals and restoring clock signals occur based on the multi-slope characteristics of the sensing clock driver and restoring clock driver. The MOS transistors within the restoring clock driver will also form a DC current path together with a part of the sense amplifier, thereby dissipating DC currents also. This will cause a large dynamic power loss in the whole high density memory device.

SUMMARY OF THE INVENTION

Therefore it is a first object of the present invention to provide a sense amplifier driver in which the DC current path in the sensing clock driver is removed to prevent DC current dissipation for the time when the precharge operation for the sense amplifier is being started upon termination of sensing operation.

It is a second object of the present invention to provide a sense amplifier driver in which DC current path in restoring clock driver is removed to prevent DC current dissipation for the time when the precharge operation for the sense amplifier is being started upon termination of restoring operation.

An embodiment of the present invention will be presented in the form of a sense amplifier driver constituted by the sensing clock driver as follows. Therefore sensing clock driver according to the present invention includes: a first inverter for inverting the sensing clock input; a second inverter consisting of a p-channel MOS transistor having a small current driving capability and an n-channel MOS transistor having a large current driving capability, for re-inverting the output of the first inverter; a delay means for delaying the output of the first inverter; and an additional p-channel MOS transistor having a gate connected to the output terminal of the delay means, a drain connected to the output terminal of the second inverter to form a common output node, and a source connected to the power line. The additional p-channel MOS transistor holds a current driving capability larger than that of the p-channel transistor within the second inverter. The sensing enable signal derived from the common output node of the second inverter is also connected to the gate of the sensing transistor coupled with the lower potential node of the sense amplifier which bears a multi-slope characteristics. Further, a means is provided for forcibly pulling up the gate voltage of the additional p-channel MOS transistor to the power voltage level immediately when the sensing clock is disabled. During the trailing transient period of the sensing clock signal for disabling the sensing operation, the additional p-channel MOS transistor which has a large current driving capability is primarily turned off. This is so because the pull-up means for pulling up the gate voltage of the additional p-channel MOS transistor is turned on, with the ultimate result that the formation of a DC current path between the power line and the ground line is prevented, thereby making it possible to avoid the dynamic DC power dissipation.

Another embodiment of the present invention in the form of a sense amplifier driver including a restoring clock driver will be explained hereinafter. The restoring clock driver according to the present invention includes: a first inverter for inverting the restoring clock derived from a delay means which generates restoring clock by delaying the sensing clocks for a predetermined period of time; and a second inverter consisting of a plurality of p-channel MOS transistors which are arranged in parallel relative to the output terminal of the first inverter. The p-channel MOS transistor are turned on successively at different time points in response to the outputs of the first inverter, and are provided with time delaying resistances between their gates. The restoring enable signals derived from the output node of the second inverter is connected to the higher potential node of the sense amplifier will have multislope characteristics. Moreover, a means is provided for forcibly pulling up to the power voltage level the gate voltage of at least a p-channel MOS transistor having a delayed operating characteristics within the second inverter, as soon as the restoring clock is disabled.

In the trailing transient period of the restoring clock signal the restoring operation is disabled. The pull-up means is turned on, and in turn the gate of at least a p-channel MOS transistor which has a delayed operating characteristics within the second inverter is forcibly pulled up to simultaneously turn off the respective p-channel MOS transistors within the second inverter. The result is that, during the time when the precharge operation of a sense amplifier is being started by an equalization clock signal in order to precharge the sense amplifier, the formation of a DC current path between the power line and the ground line in any of the p-channel MOS transistors of the second inverter will be prevented.

BRIEF DESCRIPTION OF THE DRAWINGS

The above objects and other advantages of the present invention will become more apparent by describing the preferred embodiments of the present invention in detail with reference to the attached drawings in which.

DESCRIPTION OF THE PREFERRED EMBODIMENTS

First, in order to give an assistance for understanding the device of the present invention, a conventional cross-coupled sense amplifier driver will be described referring to FIGS. 1 through 4.

Figure 1:
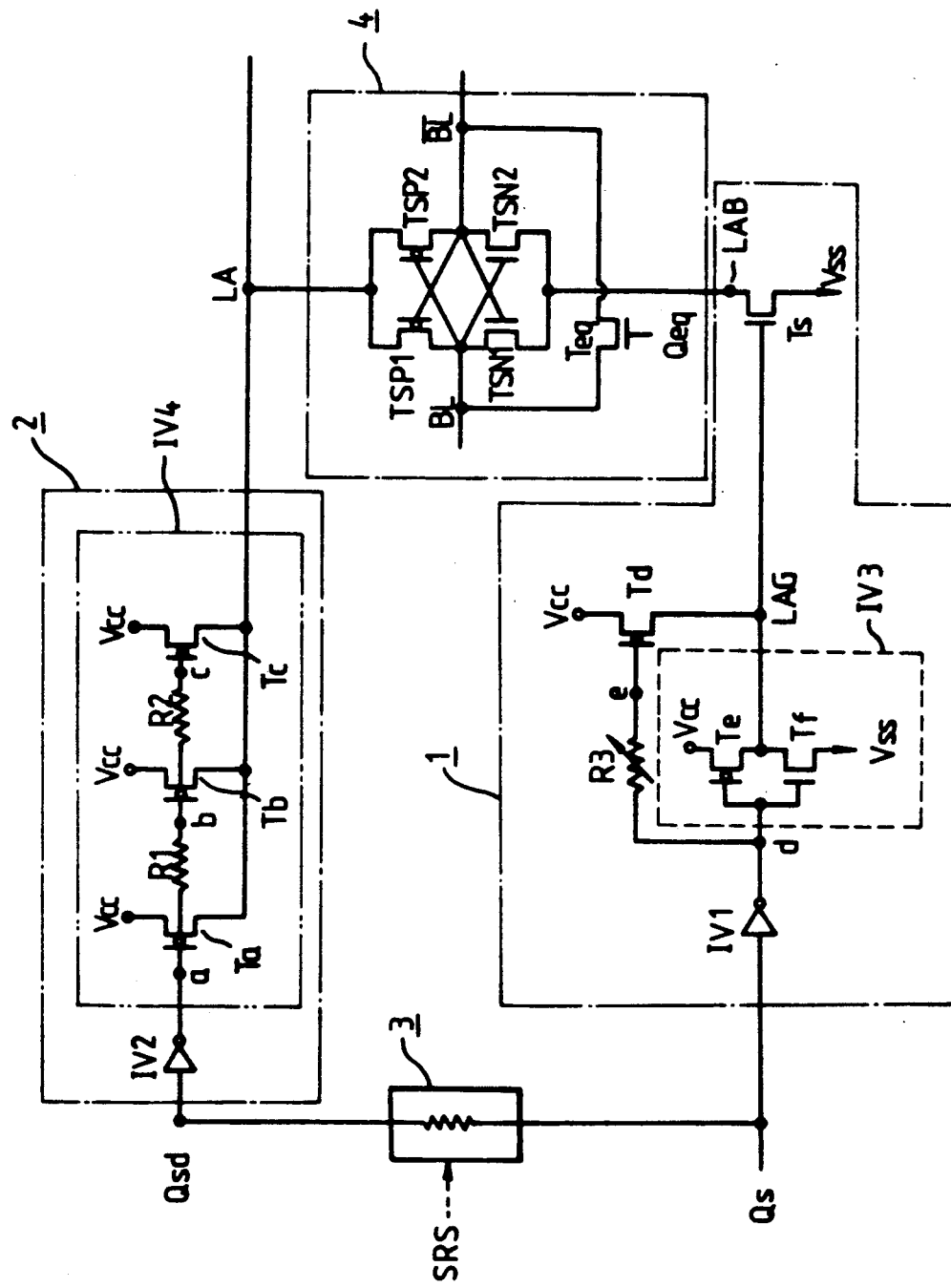
FIG. 1 illustrates the detailed circuitry of the sense amplifier driver according to the conventional technology.

As shown in FIG. 1, sense amplifier driver for sensing the data stored in a memory cell, in general, consists of a sensing clock driver 1, a restoring clock driver 2, a delay means 3 and a sense amplifier 4.

In the circuit of said sense amplifier driver, a sensing clock driver 1 is constituted such that an n-channel MOS sense transistor Ts is controlled by means of a sensing clock signal Qs, which is delivered through a first inverter IV1 and a second inverter IV3. The second inverter IV3 consists of p and n-channel MOS transistors Te and Tf. Further the sensing clock driver 1 is also constituted such that the n-channel MOS sense transistor Ts can be controlled by means of the output of an additional p-channel MOS transistor Td which is driven by means of the sensing clock signal Qs delivered through the first inverter IV1 and a delaying resistance R3.

The sense amplifier driver also includes, a restoring clock driver 2 which is constituted such that delaying resistances R1 and R2 are placed between the gates of p-channel MOS transistors Ta–Tc which are arranged in parallel for sequentially turning on a plurality of transistors Ta–Tc by means of restoring clock signals Qsd which is derived from the delay means 3 and delivered through another inverter IV2. The p-channel MOS transistors Ta–Tc compose a still another inverter IV4.

The sense amplifier 4 includes mutually cross-coupled p-channel MOS transistors TSP1, TSP2 and n-channel MOS transistors TSN1, TSN2 data restoring and sensing operations are carried out by the output signal LA of the restoring clock driver 2 and by the output signal LAB of the sensing clock driver 1. The former being applied on the higher potential node of the sense amplifier, and the latter being applied on the lower potential node of the sense amplifier.

Figure 2:
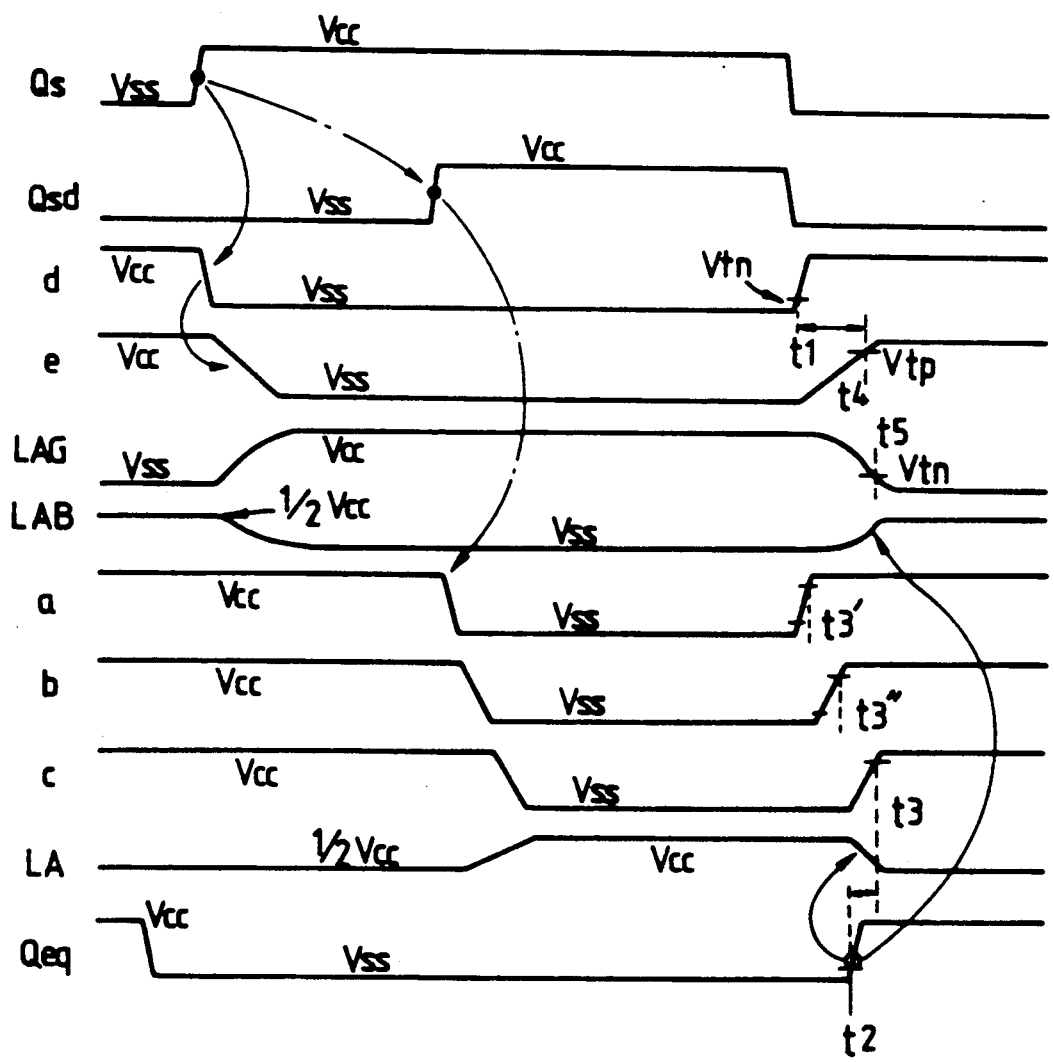
FIG. 2 is a timing chart illustrating the operations of inputs and outputs of essential parts of the circuitry of FIG. 1.

Now, the operation of conventional sense amplifier driver constituted as above will be described by referring to FIG. 2 in which a timing chart thereof is illustrated. If the equalization control clock signal Qeq is at the Vss level and the sensing clock signal Qs is at the Vcc level to permit a sensing enable state, then node "d" of sensing clock driver 1 goes to low level. Accordingly, the p-channel MOS transistor Te is turned on, but the current driving capability of this transistor Te is relatively small, with the result that the n-channel MOS sense transistor Ts can not be turned on sufficiently. Therefore, the n-channel MOS sense transistor Ts does not immediately respond to the relatively steep sloped signal of node "d", but is turned on in a slow manner.

Subsequently, if the potential of node "e" reaches the Vss level after a certain time-delay by means of the resistance R3, the additional p-channel MOS transistor Td having a current driving capability larger than that of the transistor Te is turned on. Accordingly, the potential of the node LAG reaches the Vcc level through a gentle slope to completely turn on the n-channel MOS sense transistor Ts, and therefore, the sensing signal LAB comes down from ½ Vcc level to Vss level through a gentle slope to sense the data.

Meanwhile, the sensing clock signal Qs passes through delay means 3 to produce a restore clock signal Qsd which is supplied to restoring clock driver 2.

Figure 3:
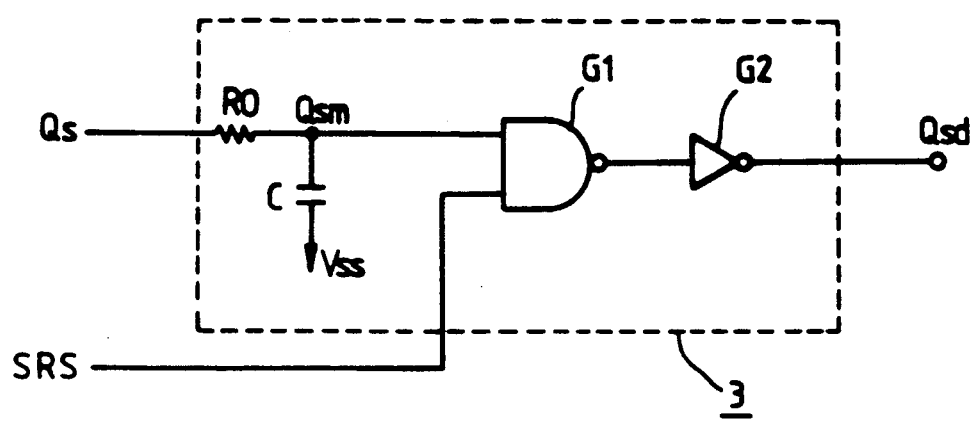
FIG. 3 is a circuit showing the details of the delay means of the sensing clock of FIG. 1.
Figure 4:
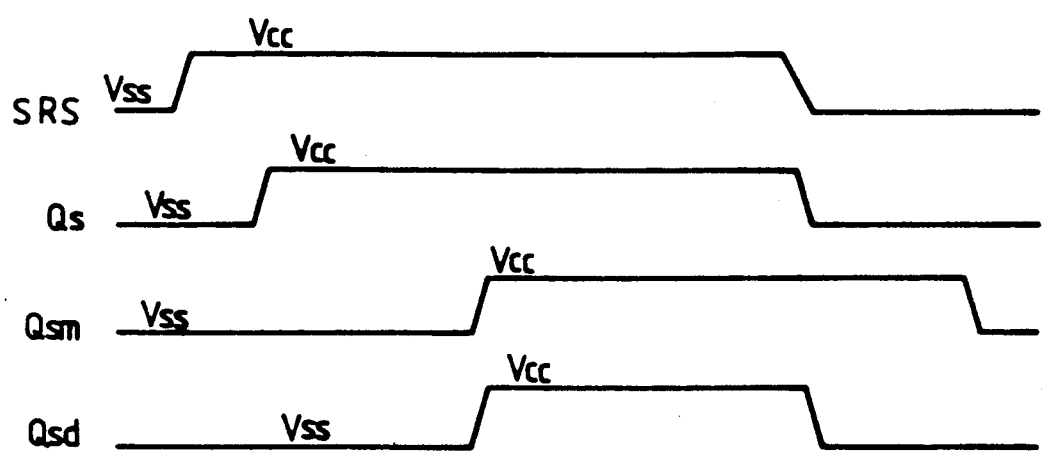
FIG. 4 is a timing chart illustrating the functions of the circuit of FIG. 3.

Now the process of the formation of the restoring clock Qsd by delay means 3 will be described in detail referring to FIGS. 3 and 4. The sensing clock Qs is supplied to an input terminal Qsm of a NAND gate G1 after passing through delaying resistance RO, while a capacitor C is connected between the input terminal of the NAND gate G1 and the ground line Vss. Further, a sensing/restoring strobe signal SRS is applied on another input terminal of the NAND gate G1. An inverter G2 inverts the output of the NAND gate G1 to produce a restoring clock signal Qsd. The sensing/restoring strobe signal SRS is kept at a high potential level equivalent to Vcc during the sensing and restoring operations, accordingly as the sensing clock signal Qs is raised from the Vss level to the Vcc level for enabling the sense transistor Ts, the potential of the input terminal Qsm of the NAND gate G1 is raised from the Vss level to the Vcc level based upon the charging operation of capacitor C. This occurs after a certain period of time due to the delaying resistance RO. At the same time, the potential of output terminal of inverter G2 also raises from Vss level to the Vcc level, thereby making it possible to produce the restoring clock signal Qsd. Hence which the restoring enable operation can be initiated.

Meanwhile, disabling of sensing operation is synchronized with disabling of sensing/restoring strobe signal SRS. When the falling edge of the sensing clock signal Qs appears, the potential of the input terminal of the NAND gate G1, i.e., the potential of the terminal Qsm of capacitor C drops from Vcc level to Vss level after a certain period of time due to the delaying resistance RO.

However, as described before, the sensing/restoring strobe signal SRS, which drops to low level, is applied to another input terminal of NAND gate G1, and therefore, the output Qsd of inverter G2 is forcibly brought down from Vcc level to Vss level in synchronization with the falling edge of the sensing/restoring strobe SRS. Thus the disable state of the restoring clock signal Qsd is produced almost simultaneously as the disable state of the sensing clock signal Qs. Therefore, as the restoring clock signal Qsd is enabled after being delayed for a certain period of time from the time of the enabling of sensing clock signal, the p-channel MOS transistor Ta is turned on, while the p-channel MOS transistor Tb is turned on after being delayed by resistance R1. Again, the p-channel MOS transistor Tc is turned on after being delayed by resistance R2, with the result that the potential of the restoring signal LA of restoring clock driver 2, which is applied on higher potential node of sense amplifier 4, is raised from ½ Vcc level to Vcc level with a gentle slope to restore the data to sense amplifier 4.

However, in such a conventional circuitry, during the disabling of the sensing clock signal Qs, the p-channel MOS transistor Tc of the restoring clock driver 2 and the p-channel MOS transistor Td of the sensing clock driver 1 are turned off after being delayed for a certain period of time, thereby forming a DC current path between the power line and the ground line. More specifically, in sensing clock driver 1, a DC current path is formed between the power line Vcc and the ground line Vss through the p and n-channel MOS transistors Td, and Tf. This occurs during the period of time starting from time t1 at which the potential of node "d" is raised to threshold voltage Vtn for turning on the n-channel MOS transistor Tf, to time t4 at which time the potential of node "e" is raised to the threshold voltage Vtp for turning off the p-channel MOS transistor Td.

Meanwhile, in the restoring clock driver 2, a DC current path is formed either sequentially through p-channel MOS transistor Tc, the p-channel MOS transistor TSP1, the equalization transistor Teq, the n-channel MOS transistor TSN2 and the n-channel MOS sense transistor Ts, or sequentially through p-channel MOS transistor Tc, p-channel MOS transistor TSP2, the equalization transistor Teq, n-channel MOS transistor TSN1 and the n-channel MOS sense transistor Ts. This occurs during the period of time starting from time t2 at which time the equalization control clock begins to raise from Vss level to Vcc level, to time t3 at which time p-channel MOS transistor Tc is turned off.

Thus, when the sensing clock signal Qs and the restoring clock signal Qsd are disabled, the peak current increases for a certain period of time, and an unnecessary power loss results.

Figure 5:
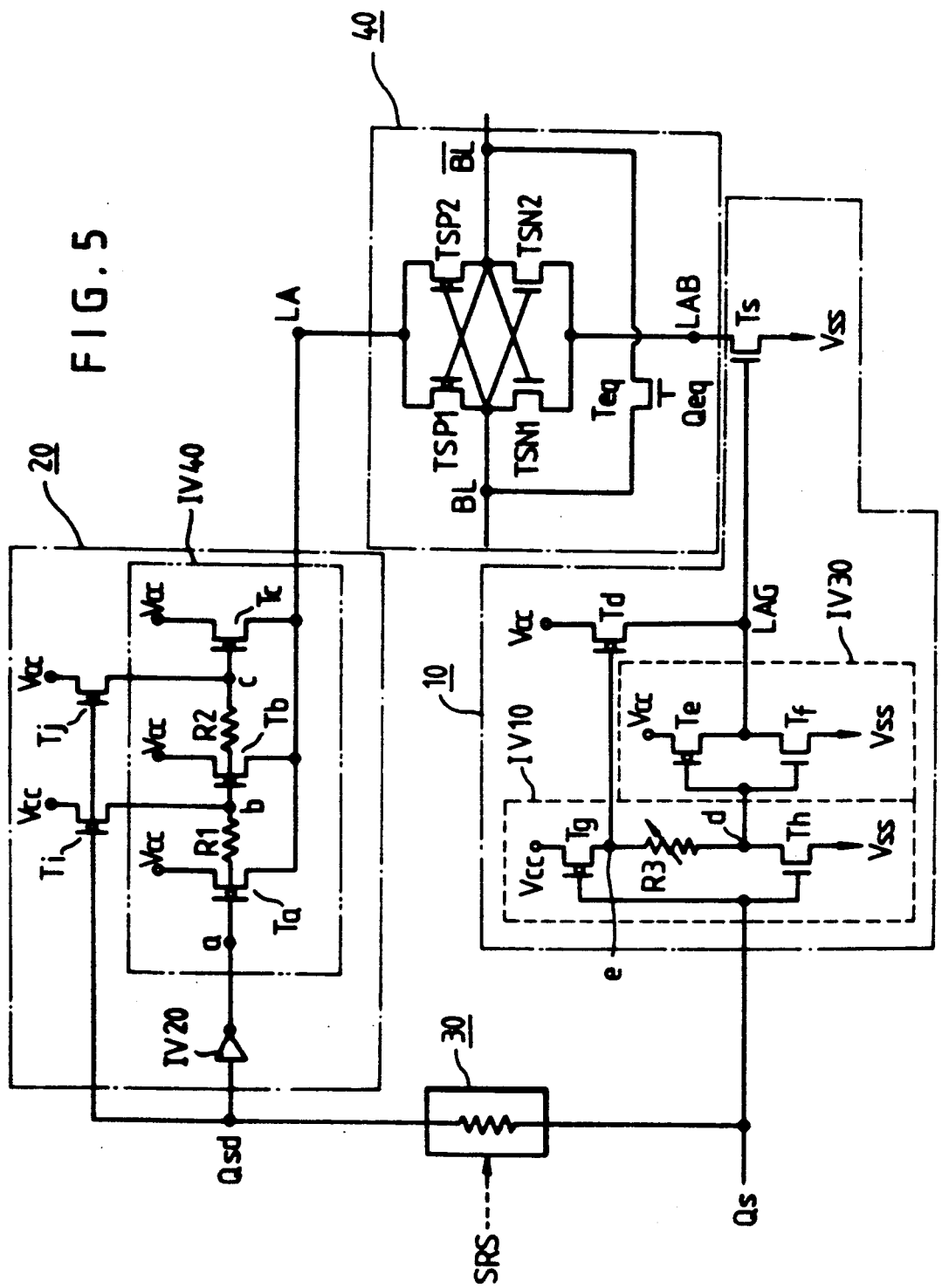
FIG. 5 is a detailed circuitry of a sense amplifier driver according to the present invention.
Figure 6:
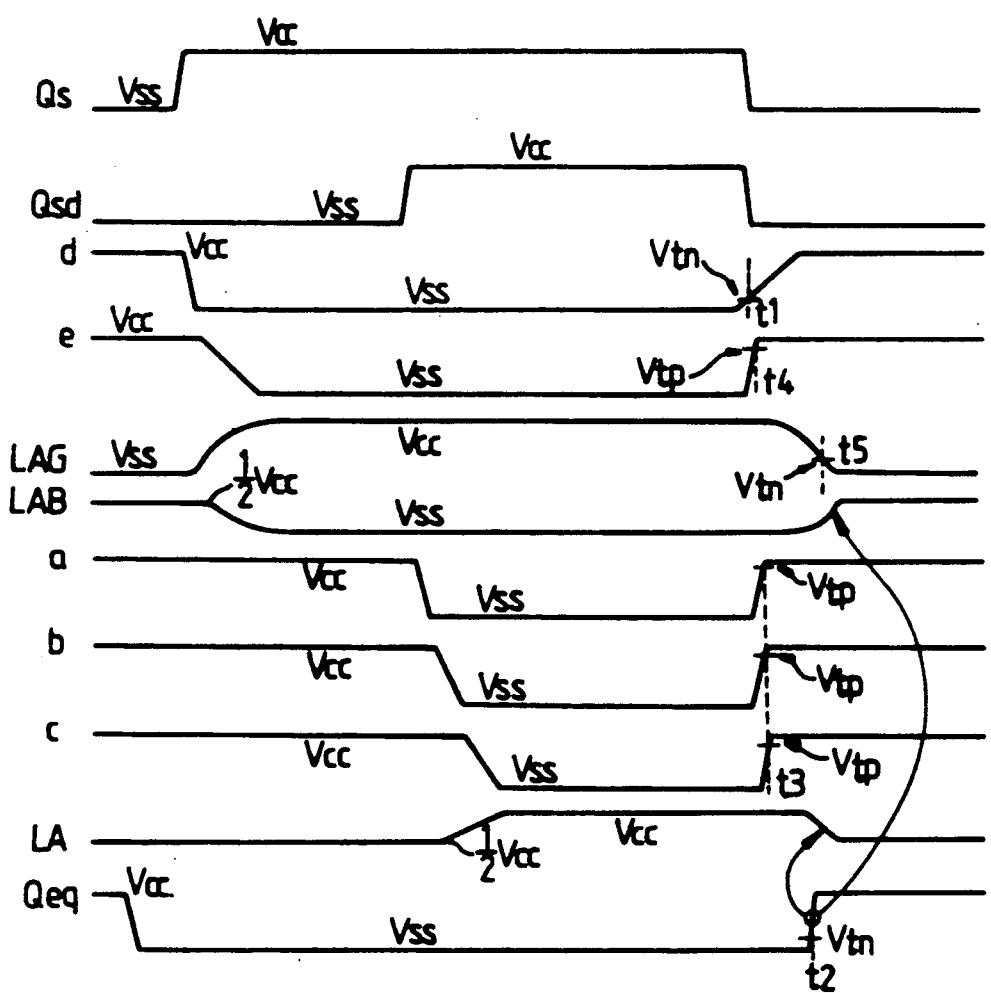
FIG. 6 is a timing chart illustrating the operations of the inputs and outputs of essential parts shown in the circuit of FIG. 5.

FIGS. 5 and 6 respectively illustrate the sense amplifier driver circuitry for a memory device and the timing chart of the operation of the circuitry according to the present invention which is intended to solve the problem experienced by conventional devices.

Referring to FIG. 5, a sensing clock driver 10 consists of an inverter IV10 having two outputs, an additional p-channel MOS transistor Td having a large current driving capability, and an inverter IV30. The double output inverter IV10 comprises a delaying resistance R3 and p and n-channel MOS transistors Tg and Th. The inverter IV30 comprises p and n-channel MOS transistors Te and Tf. The sensing clock driver 10 thus includes, sensing clock signal Qs which is supplied through inverter IV10 both to the additional p-channel MOS transistor Td, and to inverter IV30.

More specifically, connection terminal "e" between p-channel MOS transistor Tg and resistance R3 within the inverter IV10 is connected to the gate of the p-channel MOS transistor Td. The connection terminal "d" between n-channel MOS transistor Th and the resistance R3 within inverter IV10 is connected to the input terminal of inverter IV30. The drain of p-channel MOS transistor Td and the output terminal of inverter IV30 are connected to a common output terminal LAG which is connected to the gate of sense transistor Ts.

In the embodiment of FIG. 5, upon the disabling of the sensing clock signal Qs, the p-channel MOS transistor Tg of inverter IV10 is functions as a means for forcibly pulling up the gate voltage of the additional p-channel MOS transistor Td to the level of power source voltage in order to prevent the formation of a DC current path.

Also in FIG. 5, restoring clock driver 20 consists of an inverter IV20, a plurality of p-channel MOS pull-up transistors Ti, Tj, and an inverter IV40 which consists of a plurality of p-channel MOS transistors Ta-Tc and resistances R1,R2 installed between the gates of transistors Ta-Tc. A delay means 30 which is constituted in the same way as the delay means 3 of FIG. 3 supplies the restoring clock signal Qsd to restoring clock driver 20. Restoring clock signal Qsd thus delivered passes through inverter IV20 to the gates of the transistors Ta-Tc. The transistors Ta-Tc successively turn on or off by the resistances R1, R2. Further, the restoring clock signal Qsd derived from delay means 30 is also supplied to the gates of the plurality of p-channel MOS pull-up transistors Ti,Tj so that, upon feeding of restoring signals of the Vss level, the Vcc level voltage can be supplied through the respective p-channel MOS transistors Ti, Tj to the gates of the p-channel MOS transistors Ta-Tc.

Upon disabling of the restoring clock signal Qsd, the p-channel MOS pull-up transistors Ti, Tj functions as means for forcibly pulling up the gate voltages of the p-channel MOS transistors Tb, Tc within inverter IV40 having a delayed operation characteristics, immediately to the power source voltage level in order to prevent the formation of a DC current path.

The sensing and restoring output signals LAB and LA delivered from the drain of the n-channel MOS sense transistor Ts and from the drains of the p-channel MOS transistors Ta-Tc are supplied to sense amplifier 40 of FIG. 5. Specifically, these signals LAB, LA are respectively supplied to the common source (a lower potential node) of two n-channel MOS transistors TSN1, TSN2, and to the common source (a higher potential node) of two p-channel MOS transistors TSP1, TSP2, thereby making it possible to carry out the sensing and restoring operations for the cell data. Four transistors TSN1, TSN2, TSP1, TSP2 are cross-coupled to one another.

Now, the operation and effects of the circuit of the present invention will be further described by referring to the timing chart of FIG. 6. If a sensing enable state is established by the equalization control clock Qeq being at the Vss level and the sensing clock signal Qs being at the Vcc level, then node "d" of sensing clock driver 10 to Vss level immediately owing to the function of n-channel MOS transistor Th of inverter IV10. Therefore, the p-channel MOS transistor Te of the inverter IV30 immediately turns on. However, since transistor Te has small current driving capability, the common output node LAG is not immediately raised to high level, i.e., to the Vcc level.

Subsequently, if the potential of node "e" is lowered to Vss level after having been delayed for a certain period of time due to the function of resistance R3 of inverter IV10, then the additional p-channel MOS transistor Td having a large current driving capability turns on. Therefore, the potential of node LAG raises to Vcc level with a multi-slope characteristics, so that it can completely turn on the n-channel MOS sense transistor Ts. The resultant sensing signal LAB of the Vss level obtained through the turning-on operation of the n-channel MOS sense transistor Ts carries out the sensing operation for the data stored in the memory cell.

Meanwhile, the restoring clock signal Qsd delivered through delay means 30 is supplied through inverter IV20 to successively turn on a plurality of p-channel MOS transistors Ta-Tc. Accordingly, the sensed data as described above is restored by restoring signal LA of Vcc level. During this process, pull-up p-channel MOS transistors Ti, Tj are not operative, and therefore, they can not exert any influence on the aforementioned restoring operation.

Now the disabling of sensing clock signal Qs will be described hereinafter. If sensing clock signal Qs drops to low level, the drain of p-channel MOS transistor Tg of the inverter IV10, i.e., the node "e" immediately raises to Vcc level so that p-channel MOS transistor Td having a large current driving capability immediately turns off. Then, when the potential of node "d" is saised to Vcc level, p-channel MOS transistor Te turns off, and n-channel MOS transistor Tf turns on. Accordingly, the potential of node LAG goes to Vss level to turn off the n-channel MOS sense transistor Ts.

As may be understood from the above descriptions, there is almost no time lag between time t1 at which the n-channel MOS transistor Tf is turned on and time t4 at which the p-channel MOS transistor Td is turned off. Therefore, there is no possibility of the formation of a DC current path which causes dynamic power losses in the p-channel MOS transistor Td between the power line and the ground line.

Meanwhile the restoring clock signal Qsd of the low level will turn off the p-channel MOS transistors Ta-Tc within inverter IV40 after passing through inverter IV20. The restoring clock signal Qsd of low level will turn on pull-up transistors Ti, Tj immediately without causing any time delay. Accordingly, the gates of p-channel MOS transistors Tb and Tc are instantly pulled up to Vcc level, and therefore, p-channel MOS transistors Tb and Tc are instantly pulled up to Vcc level, and therefore, the p-channel MOS transistors Tb and Tc are all immediately turned off at time t3 without any time delay due to resistances R1 and R2. The result is that the current path from power line will no longer exist by time t2 at which time the equalization clock signal Qeq is enabled. Therefore, the possiblity of a DC current path between power line and ground line through p-channel MOS transistor Tc, sense amplifier 40 and n-channel MOS sense transistor Ts is prevented, and only the voltage of restoring node LA is synchronized with the rising edge of equalization clock signal Qeq, so that it would come down through sense amplifier 40 from Vcc level to ½ Vcc level.

Further, another embodiment of means for pulling up gate voltage of additional p-channel MOS transistor Td immediately to power source voltage level upon disabling of sensing clock Qs, although not illustrated in the drawing, can be realized by adding a p-channel MOS transistor having the following connections in sensing clock driver 1 of FIG. 1. That is, the means for pulling up the voltage of the gate of additional p-channel MOS transistor Td can be made by including a p-channel MOS transistor having a gate connected to input terminal of first inverter IV1 of FIG. 1, a source connected to power line, and a drain connected to the gate of the additional p-channel MOS transistor Td. Even in this embodiment as in the case of FIG. 5, the additional p-channel MOS transistor Td is preferentially turned off during the trailing transient position of sensing clock signal Qs for disabling the sensing operation, as the pull-up means for the gate voltage of the additional p-channel MOS transistor Td is turned on, thereby preventing the formation of a DC current path between the power line and the ground line.

Thus the circuit of the present invention as described above can effectively inhibit the sudden rise of the peak current during sensing and restoring of data in a memory cell, and can also prevent any unnecessary dynamic power dissipations.

It should also be understood that the foregoing relates to only a preferred embodiment of the invention, and that it is intended to cover all changes and modifications of the example of the invention herein chosen for the purposes of the disclosure, which do not constitute departures from the spirit and scope of the invention.

What is claimed is:

1. A sense amplifier driver including a sensing clock driver for delivering a sensing enable signal in response to a sensing clock signal, said sensing enable signal being delivered to a sensing enable terminal of a data sensing amplifier coupled between a pair of bit lines, and a restoring clock driver for delivering a restoring enable signal to a restoring enable terminal of said data sensing amplifier in response to a restoring clock signal, a rising edge and a falling edge of said sensing enable signal having multi-slope characteristics, said sensing clock driver further comprising:

a first inverter for respectively generating a first output signal and a second output signal in response to said sensing clock signal, said first output signal having a rapid rising transient edge and a slow falling transient edge, said second output signal having a slow rising transient edge and a rapid falling transient edge:

a second inverter, having a p-channel MOS transistor and an n-channel MOS transistor, for inverting said second output signal of the first inverter;

a p-channel MOS transistor having a gate coupled with said first output signal of the first inverter, a drain coupled to an output terminal of said second inverter and a source coupled with a power source voltage, and having a current driving capability larger than that of said p-channel MOS transistor of the second inverter, said p-channel MOS transistor being slowly turned on and rapidly turned off in response to said first output signal of the first inverter; and an n-channel MOS transistor having a gate coupled to said output terminal of the second inverter, a source coupled to said sensing enable terminal of the data sensing amplifier and a drain coupled with a ground voltage.

2. The sense amplifier driver as claimed in claim 1, wherein said first inverter comprises a p-channel MOS transistor having a gate coupled with said sensing clock signal, a source coupled with said power source voltage and a drain coupled to said gate of the p-channel MOS transistor responding to said first output signal; an n-channel MOS transistor having a gate coupled with said sensing clock signal, a source coupled with said ground voltage and a drain coupled to an input terminal of said second inverter; and a delay means, coupled between said drains of the p-channel and n-channel MOS transistors of the first inverter, for retarding the falling transient of said first output signal and the rising transient of said second output signal.

3. The sense amplifier driver as claimed in claim 1, wherein said restoring clock driver comprises:

an inverter for inverting said restoring clock signal;

a first plurality of p-channel MOS transistors to each other in parallel between said power source voltage and said restoring enable terminal of the data sensing amplifier, the respective gates thereof connected to an output terminal of said inverter via a respective delay means, and a second plurality of p-channel MOS transistors, each having a gate coupled with said restoring clock signal, a source coupled with said power source voltage and a drain coupled to the gate of a corresponding one of said first plurality of p-channel MOS transistors.

* * * * *